(12) United States Patent
Ravindran et al.

(10) Patent No.: US 8,923,782 B1
(45) Date of Patent: Dec. 30, 2014

(54) SWITCHING DEVICE WITH DIODE-BIASED FIELD-EFFECT TRANSISTOR (FET)

(71) Applicant: TriQuint Semiconductor, Inc., Hillsboro, OR (US)

(72) Inventors: Arjun Ravindran, Orlando, FL (US); James P. Furino, Jr., Melbourne, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 135 days.

(21) Appl. No.: 13/772,289

(22) Filed: Feb. 20, 2013

(51) Int. Cl.
  *H04B 1/44* (2006.01)
  *H01L 21/70* (2006.01)
  *H03K 17/687* (2006.01)
  *H01L 25/18* (2006.01)

(52) U.S. Cl.
  CPC . *H01L 25/18* (2013.01); *H04B 1/44* (2013.01)
  USPC .............................. 455/78; 257/368; 327/434

(58) Field of Classification Search
  USPC ........ 455/78, 79, 83; 327/365, 389, 419, 427, 327/434; 257/288, 368
  See application file for complete search history.

(56) References Cited

U.S. PATENT DOCUMENTS

| | | | |
|---|---|---|---|
| 3,551,788 | A | 12/1970 | Summer |
| 3,699,359 | A | 10/1972 | Shelby |
| 4,053,916 | A | 10/1977 | Cricchi et al. |
| 4,316,101 | A | 2/1982 | Minner |
| 4,491,750 | A | 1/1985 | Janutka |
| 5,012,123 | A | 4/1991 | Ayasli et al. |
| 5,146,178 | A | 9/1992 | Nojima et al. |
| 5,313,083 | A | 5/1994 | Schindler |
| 5,416,043 | A | 5/1995 | Burgener et al. |
| 5,492,857 | A | 2/1996 | Reedy et al. |
| 5,548,239 | A | 8/1996 | Kohama |
| 5,553,295 | A | 9/1996 | Pantelakis et al. |
| 5,572,040 | A | 11/1996 | Reedy et al. |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Non-Final Office Action in U.S. Appl. No. 13/587,590, dated Sep. 9, 2013.

(Continued)

*Primary Examiner* — Nguyen Vo
(74) *Attorney, Agent, or Firm* — Schwabe Willamson & Wyatt

(57) ABSTRACT

Embodiments provide a switching device including a field-effect transistor (FET) having a source terminal, a drain terminal, a gate terminal, and a body terminal. The FET may be switchable between an on state, in which the FET passes a transmission signal between the source terminal and the drain terminal, and an off state, in which the FET prevents a transmission signal from passing between the source terminal and the drain terminal. The FET may receive a control signal at the gate terminal to switch the FET between the on state and the off state. The switching device may further include one or more forward diodes coupled between the gate terminal and the body terminal to bias the body terminal during the on state, and one or more reverse diodes coupled between the gate terminal and the body terminal to bias the body terminal during the off state.

22 Claims, 7 Drawing Sheets

(56) References Cited

U.S. PATENT DOCUMENTS

| | | | |
|---|---|---|---|
| 5,596,205 A | 1/1997 | Reedy et al. | |
| 5,600,169 A | 2/1997 | Burgener et al. | |
| 5,663,570 A | 9/1997 | Reedy et al. | |
| 5,777,530 A | 7/1998 | Nakatuka | |
| 5,801,577 A | 9/1998 | Tailliet | |
| 5,818,099 A | 10/1998 | Burghartz | |
| 5,861,336 A | 1/1999 | Reedy et al. | |
| 5,863,823 A | 1/1999 | Burgener | |
| 5,883,396 A | 3/1999 | Reedy et al. | |
| 5,895,957 A | 4/1999 | Reedy et al. | |
| 5,920,233 A | 7/1999 | Denny | |
| 5,930,638 A | 7/1999 | Reedy et al. | |
| 5,945,867 A | 8/1999 | Uda et al. | |
| 5,973,363 A | 10/1999 | Staab et al. | |
| 5,973,382 A | 10/1999 | Burgener et al. | |
| 6,057,555 A | 5/2000 | Reedy et al. | |
| 6,066,993 A | 5/2000 | Yamamoto et al. | |
| 6,160,292 A | 12/2000 | Flaker et al. | |
| 6,173,235 B1 | 1/2001 | Maeda | |
| 6,249,027 B1 | 6/2001 | Burr | |
| 6,308,047 B1 | 10/2001 | Yamamoto et al. | |
| 6,452,232 B1 | 9/2002 | Adan | |
| 6,504,212 B1 | 1/2003 | Allen et al. | |
| 6,563,366 B1 | 5/2003 | Kohama | |
| 6,631,505 B2 | 10/2003 | Arai | |
| 6,632,724 B2 | 10/2003 | Henley et al. | |
| RE38,319 E | 11/2003 | Lin | |
| 6,642,578 B1 | 11/2003 | Arnold et al. | |
| 6,693,326 B2 | 2/2004 | Adan | |
| 6,790,747 B2 | 9/2004 | Henley et al. | |
| 6,804,502 B2 | 10/2004 | Burgener et al. | |
| 6,898,778 B2 | 5/2005 | Kawanaka | |
| 6,908,832 B2 | 6/2005 | Farrens et al. | |
| 6,924,673 B2 | 8/2005 | Tanishima | |
| 6,958,519 B2 | 10/2005 | Gonzalez | |
| 6,969,668 B1 | 11/2005 | Kang et al. | |
| 6,978,437 B1 | 12/2005 | Rittman et al. | |
| 6,989,706 B2 | 1/2006 | Sekigawa | |
| 7,056,808 B2 | 6/2006 | Henley et al. | |
| 7,057,472 B2 | 6/2006 | Fukamachi et al. | |
| 7,058,922 B2 | 6/2006 | Kawanaka | |
| 7,123,898 B2 | 10/2006 | Burgener et al. | |
| 7,138,846 B2 | 11/2006 | Suwa | |
| 7,158,067 B2 | 1/2007 | Lauritzen | |
| 7,404,157 B2 | 7/2008 | Tanabe | |
| 7,460,852 B2 | 12/2008 | Burgener et al. | |
| 7,616,482 B2 | 11/2009 | Prall | |
| 7,796,969 B2 | 9/2010 | Kelly et al. | |
| 7,860,499 B2 | 12/2010 | Burgener et al. | |
| 7,863,691 B2 | 1/2011 | Wagner, Jr. et al. | |
| 7,890,891 B2 | 2/2011 | Stuber et al. | |
| 7,910,993 B2 | 3/2011 | Brindle et al. | |
| 8,129,787 B2 | 3/2012 | Brindle et al. | |
| 8,159,283 B2 | 4/2012 | Sugiyama | |
| 2001/0015461 A1 | 8/2001 | Ebina | |
| 2001/0045602 A1 | 11/2001 | Maeda et al. | |
| 2002/0195623 A1 | 12/2002 | Horiuchi | |
| 2003/0002452 A1 | 1/2003 | Sahota | |
| 2003/0205760 A1 | 11/2003 | Kawanaka et al. | |
| 2004/0080364 A1 | 4/2004 | Sander et al. | |
| 2005/0167751 A1 | 8/2005 | Nakajima et al. | |
| 2007/0023833 A1 | 2/2007 | Okhonin et al. | |
| 2008/0073719 A1 | 3/2008 | Fazan et al. | |
| 2008/0076371 A1 | 3/2008 | Dribinsky et al. | |
| 2008/0303080 A1 | 12/2008 | Bhattacharyya | |
| 2009/0029511 A1 | 1/2009 | Wu | |
| 2009/0261896 A1* | 10/2009 | Tzu-Chien et al. | 327/543 |
| 2011/0227637 A1 | 9/2011 | Stuber et al. | |
| 2012/0169398 A1 | 7/2012 | Brindle et al. | |
| 2012/0267719 A1 | 10/2012 | Brindle et al. | |
| 2014/0009212 A1* | 1/2014 | Altunkilic et al. | 327/427 |
| 2014/0009214 A1 | 1/2014 | Altunkilic | |
| 2014/0227983 A1* | 8/2014 | Clausen et al. | 455/78 |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Non-Final Office Action in U.S. Appl. No. 13/742,086, dated Sep. 20, 2013.

Notice of Allowance in U.S. Appl. No. 13/587,590 dated Jan. 7, 2014.

Final Office Action in U.S. Appl. No. 13/742,086, dated Mar. 4, 2014.

Assaderaghi, et al.; "Dynamic Threshold-Voltage MOSFET (DTMOS) for Ultra-Low Voltage VLSI;" IEEE. vol. 44; No. 3; 414-421; Mar. 1997.

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-$\Omega$ Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

Hameau, F. et al., "Radio-Frequency Circuits Integration Using CMOS SOI 0.25μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

(56) References Cited

OTHER PUBLICATIONS

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications;" IEEE; vol. 45; No. 5; May 1998.

Kuang, J. et al., "A floating-body charge monitoring technique for partially depleted SOI technology," Int. J. Electronics, Nov. 2004, pp. 625-637, vol. 91, No. 11.

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD-SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies Overview for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin Si02 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

\* cited by examiner

US 8,923,782 B1

SWITCHING DEVICE WITH DIODE-BIASED FIELD-EFFECT TRANSISTOR (FET)

FIELD

Embodiments of the present disclosure relate generally to the field of circuits, and more particularly to switching devices with diode-biased field-effect transistors.

BACKGROUND

Radio frequency (RF) switching devices are used in many applications, such as in wireless communication systems, to selectively pass an RF signal. Many switching devices include a pair of field-effect transistors (FETs), with one FET in series with an interconnect path, and another FET in shunt with the interconnect path. The FETs are controlled by a pair of control voltages provided to each FET to bias the gate terminal and the body terminal of each FET. Thus, the switching device includes four control lines to control a series-shunt pair of FETs. Furthermore, many switching devices include a plurality of series-shunt FET pairs, which add additional control lines and complexity.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C). Additionally, the phrase "A or B" means (A), (B), or (A and B) unless explicitly stated that A and B are not to be included together.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
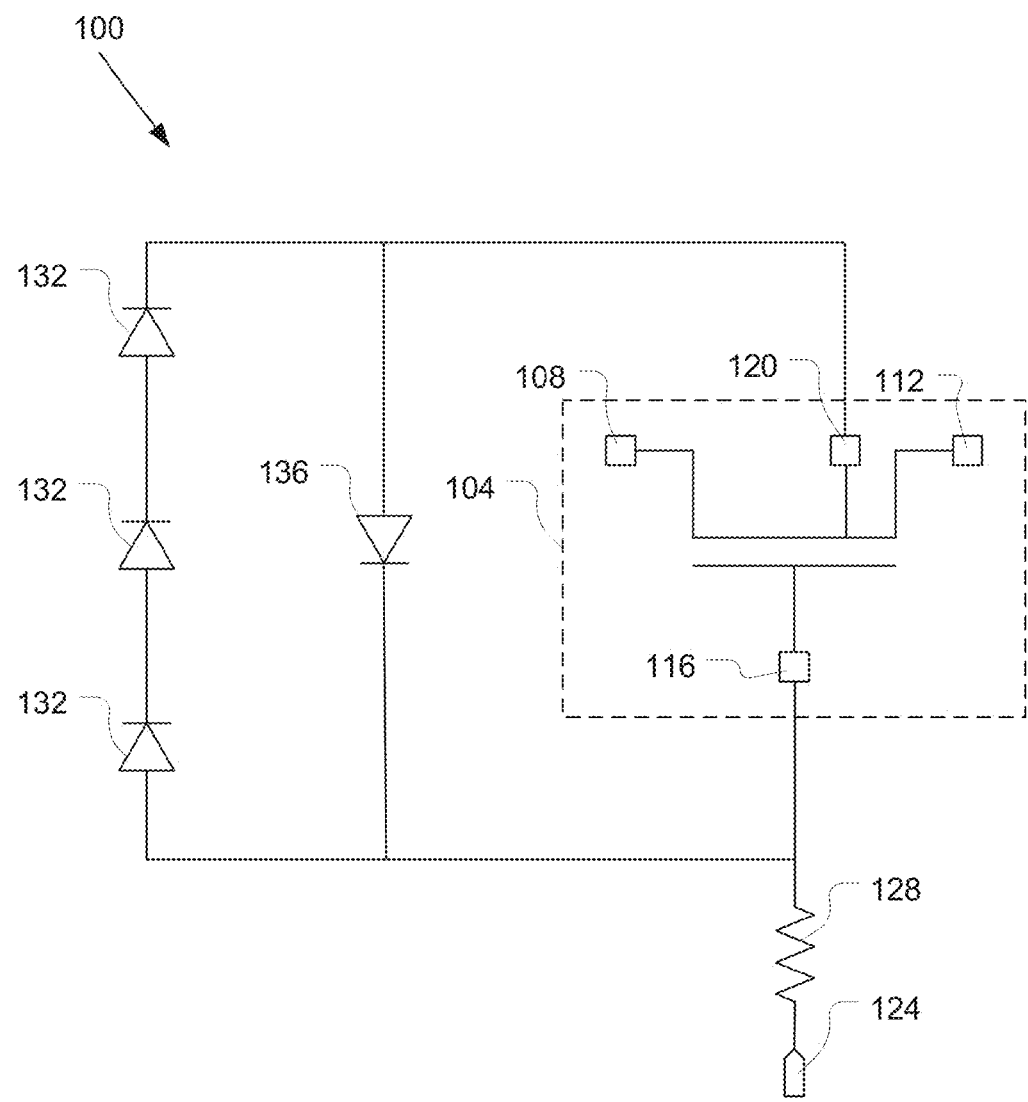
FIG. 1 illustrates a circuit diagram of a switching device in accordance with various embodiments.

FIG. 1 illustrates a switching circuit 100 in accordance with various embodiments. Switching circuit 100 (also referred to as circuit 100) may include a field-effect transistor (FET) 104 having a drain terminal 108, a source terminal 112, a gate terminal 116, and a body terminal 120. In some embodiments, the FET 104 and/or circuit 100 may be a silicon-on-insulator (SOI) device.

In various embodiments, the FET 104 may selectively transition between an off state and an on state to facilitate switching of a transmission signal (e.g., an alternating current (AC) signal such as a radio frequency (RF) signal). For example, the FET 104 may receive the transmission signal at the drain terminal 108 and pass the transmission signal to the source terminal 112 if the FET 104 is in the on state. The FET 104 may prevent the passage of the transmission signal between the drain terminal 108 and the source terminal 112 if the FET 104 is in the off state. The FET 104 may receive a control signal (e.g., from a decoder circuit (not shown)) at the gate terminal 116 to transition the FET 104 between the off state and the on state. For example, the circuit 100 may include a control terminal 124 to receive the control signal and to pass the control signal to the gate terminal 116. In some embodiments, a resistor 128 may be coupled between the gate terminal 116 and the control terminal 124. The control signal may provide a direct current (DC) voltage, as further discussed below.

In various embodiments, the circuit 100 may further include one or more forward diodes 132 coupled with and between the gate terminal 116 and the body terminal 120 of the FET 104. The forward diodes 132 may be coupled in series with one another and with a forward direction of the forward diodes 132 oriented from the gate terminal 116 to the body terminal 120. Although circuit 100 is shown with three forward diodes 132, other embodiments may include any suitable number of one or more forward diodes 132.

In various embodiments, the circuit 100 may further include a reverse diode 136 coupled between the gate terminal 116 and the body terminal 120 of the FET 104 with a forward direction of the reverse diode 136 oriented from the body terminal 120 to the gate terminal 116. Although circuit 100 is shown with one reverse diode 136, other embodiments may include any suitable number of one or more reverse diodes 136 coupled in series with one another between the gate terminal 116 and the body terminal 120.

The diodes 132 and 136 may be turned on if a voltage is applied in the forward direction (e.g., with the voltage at the reverse node greater than the voltage at the forward node of the diode) that is greater than a threshold voltage (Vth) of the diode. When the diodes 132 or 136 are on, the diodes may allow electrical current to pass in the forward direction of the diodes. Additionally, the diodes 132 or 136 may cause a voltage drop in the forward direction that is substantially equal to the threshold voltage. Conversely, if the voltage across the diodes in the forward direction is less than the threshold voltage, the diodes may be off and the diodes may block electrical current in the forward direction. Additionally, the diodes 132 or 136 may block electrical current in a reverse direction opposite the forward direction, for voltages applied in the reverse direction up to a breakdown voltage. The breakdown voltage may be significantly higher than the threshold voltage.

In various embodiments, the forward diodes 132 may each have a first threshold voltage Vth1, and the reverse diode 136 may have a second threshold voltage Vth2. The first and second threshold voltages may be the same or different, as further discussed below.

In various embodiments, the forward diodes 132 and reverse diode 136 may be used to bias the body terminal 120 of the FET 104 based on the control signal. The body terminal 120 may have a forward bias voltage during the on state of the FET 104 and a reverse bias voltage during the off state of the FET 104.

For example, the control signal may have a positive control voltage (e.g., +2.5 volts (V) DC) in the on state of the FET 104 and may have a negative control voltage (e.g., −2.5 V DC) in the off state of the FET 104. In the on state of the FET 104, the control signal may bias the gate terminal 116 at a voltage substantially equal to the positive control voltage. The positive voltage on the gate terminal 116 may turn on the forward diodes 132 and turn off the reverse diode 136. Accordingly, the forward bias voltage at the body terminal 120 may be equal to the positive control voltage at the gate minus the voltage drops provided by the forward diodes 132 (e.g., 2.5 V−3Vth1). As an example, if the forward diodes 132 are p-n diodes, the first threshold voltage Vth1 may be about 0.7V, and the forward bias voltage at the body terminal 120 may be about 0.4V in the on state of the FET 104.

In the off state of the FET 104, the control signal may bias the gate terminal 116 at the negative control voltage. This may cause the reverse diode 136 to be on and the reverse diodes 132 to be off. Accordingly, the reverse bias voltage at the body terminal 120 during the off state of the FET 104 may be equal to the negative control voltage at the gate terminal 116 plus the voltage drop provided by the reverse diode 136 (e.g., −2.5V+Vth2). As an example, if the reverse diode 136 is a p-n diode, the second threshold voltage Vth2 may be about 0.7V, and the reverse bias voltage at the body terminal 120 may be about −1.8V in the off state of the FET 104.

In various embodiments, the drain terminal 108 and source terminal 112 of the FET 104 may be biased at zero V in both the on state and the off state of the FET 104.

As discussed above, the circuit 100 may bias the body terminal 120 of the FET 104 automatically based on the bias voltage at the gate terminal 116 that is provided by the control signal. This may allow the FET 104 to be controlled by a single control line coupled with the gate terminal 116. In contrast, prior switching circuits required two control lines to provide separate control signals for the gate terminal and body terminal.

Additionally, the forward diodes 132 and/or reverse diode 136 may allow the value of the bias voltage at the body terminal 120 to be controlled to facilitate operation of the circuit 100. For example, prior FET switch designs used a decoder circuit to provide separate control voltages for the gate terminal and body terminal of the FET. The decoder circuit has access to three voltage values: a positive control voltage, a negative control voltage, and a zero voltage. The source and drain terminals are biased at the zero voltage in both the on state and the off state of the FET. Additionally, in prior FET switch designs, the body terminal is biased at zero volts and the gate terminal is biased at the positive control voltage in the on state, while in the off state the body terminal and gate terminal are both biased at the negative control voltage.

In contrast, as discussed above, the body terminal 120 of the FET 104 may be biased at a forward bias voltage during the on state that is greater than zero and less than the positive control voltage. This may forward-bias the FET 104 and may provide improved linearity (e.g., improved harmonics and/or intermodulation distortion performance) than prior designs that biased the body terminal at zero V during the on state. In some embodiments, the bias voltage of the body terminal 120 in the on state of the FET 104 may be greater than zero V and up to about 1V.

In some embodiments, as discussed above, the reverse bias voltage of the body terminal 120 in the off state of the FET 104 may be greater than the negative control voltage up to about −1V.

In various embodiments, the magnitude of the forward bias voltage or reverse bias voltage may be adjusted by selecting the type and/or quantity of the forward diodes 132 or reverse diode 136, respectively. For example, FIG. 1 shows the forward diodes 132 and reverse diode 136 as p-n diodes. Other embodiments may include other types of diodes, such as diode-connected FETs, for the forward diodes 132 and/or reverse diode 136.

Figure 2:
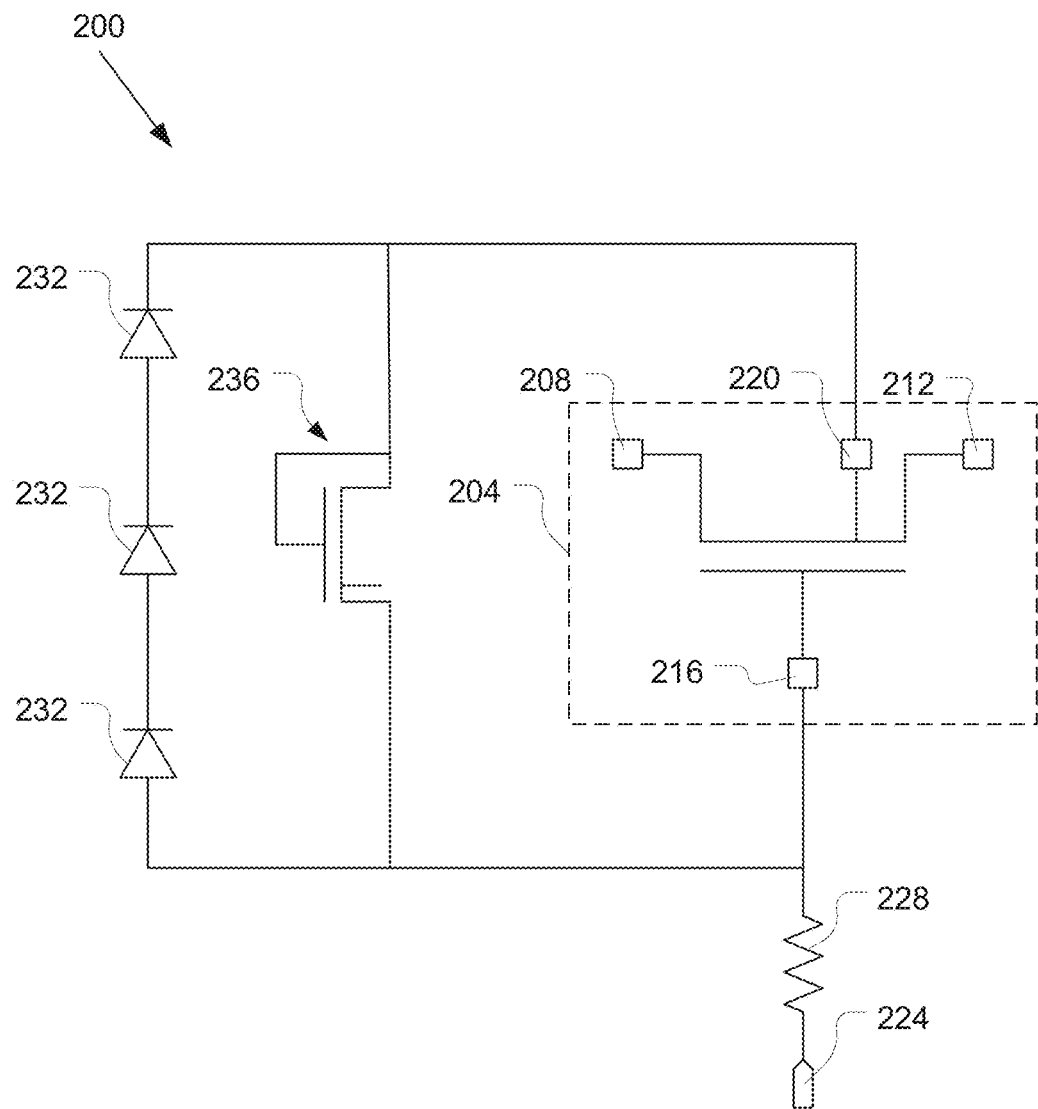
FIG. 2 illustrates a circuit diagram of another switching device in accordance with various embodiments.

For example, FIG. 2 illustrates a circuit 200 that includes similar components to circuit 100, except with a reverse diode 236 that is a diode-connected FET. Circuit 200 includes a FET 204 having a drain terminal 208, a source terminal 212, a gate terminal 216, and a body terminal 220. The circuit 200 may receive a control signal at a control terminal 224 which may be coupled with the gate terminal 216 (e.g., via a resistor 228). The circuit 200 further includes a plurality of forward diodes 232 and a reverse diode 236. The forward diodes 232 are p-n diodes, while the reverse diode 236 is a diode-connected FET. For example, the reverse diode 236 may be an n-type FET with the gate terminal of the n-type FET coupled to the drain terminal of the n-type FET. Other embodiments may use another type of FET, such as a p-type FET. The diode-connected FET may provide a voltage drop in the on state of reverse diode 236 that is less than the voltage drop provided by the p-n diodes. For example, the voltage drop of the diode-connected FET may be about 0.4V. Accordingly, the reverse bias voltage of the body terminal 220 may be more than the reverse bias voltage of the body terminal 120 of circuit 100.

Figure 3:
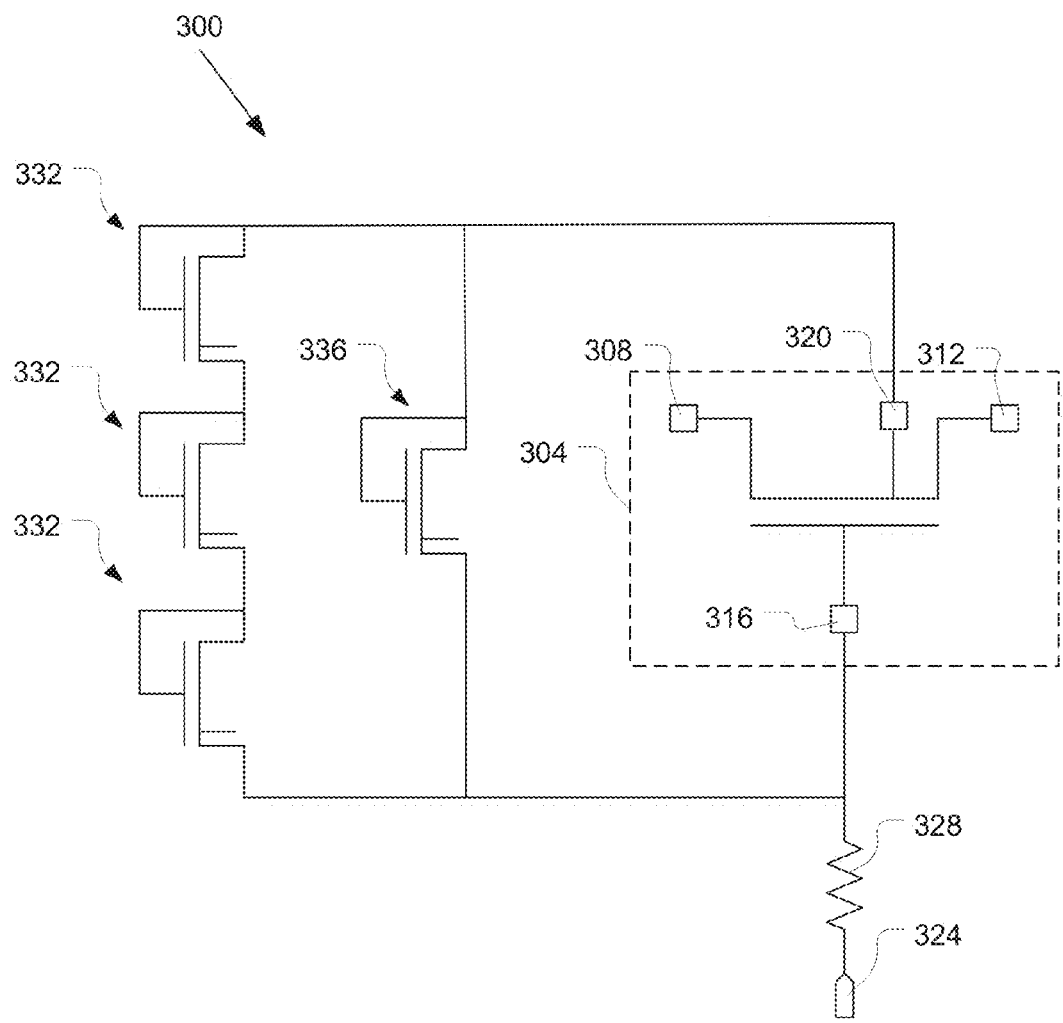
FIG. 3 illustrates a circuit diagram of another switching device in accordance with various embodiments.

FIG. 3 illustrates a circuit 300 that includes similar components to circuits 100 and 200, except with forward diodes 332 and a reverse diode 336 that are diode-connected FETs. Circuit 300 may include a FET 304 having a drain terminal 308, a source terminal 312, a gate terminal 316, and a body terminal 320. The circuit 300 may receive a control signal at a control terminal 324 which may be coupled with the gate terminal 316 (e.g., via a resistor 328). The circuit 300 may further include a plurality of forward diodes 332 and a reverse diode 336. The forward diodes 332 and reverse diode 336 are diode-connected FETs. The FETs of the forward diodes 332 and reverse diode 336 may be any suitable type of FETs, such as n-type FETs, or p-type FETs. For example, as shown in FIG. 3, the forward diodes 332 may be diode-connected p-type FETs, and the reverse diode 336 may be a diode-connected n-type FET. The diode-connected FETs may provide a voltage drop in the on state of the diode-connected FET that is lower than the voltage drop of a p-n diode. For example, the voltage drop provided by the diode-connected FET may be about 0.4V.

Circuit 300 is shown with three forward diodes 332. Accordingly, with a positive control voltage of +2.5V, the forward bias voltage of the body terminal 320 may be about +1.3V. In other embodiments, any suitable number of diode-connected FETs may be used as forward diodes 332, for example about 3 to 6 diode-connected FETs.

Accordingly, as shown in FIGS. 1, 2, and 3, the type and quantity of the forward diodes and/or reverse diodes may be selected to achieve the desired forward bias voltage or reverse bias voltage, respectively, for the body terminal of the FET.

Figure 4:
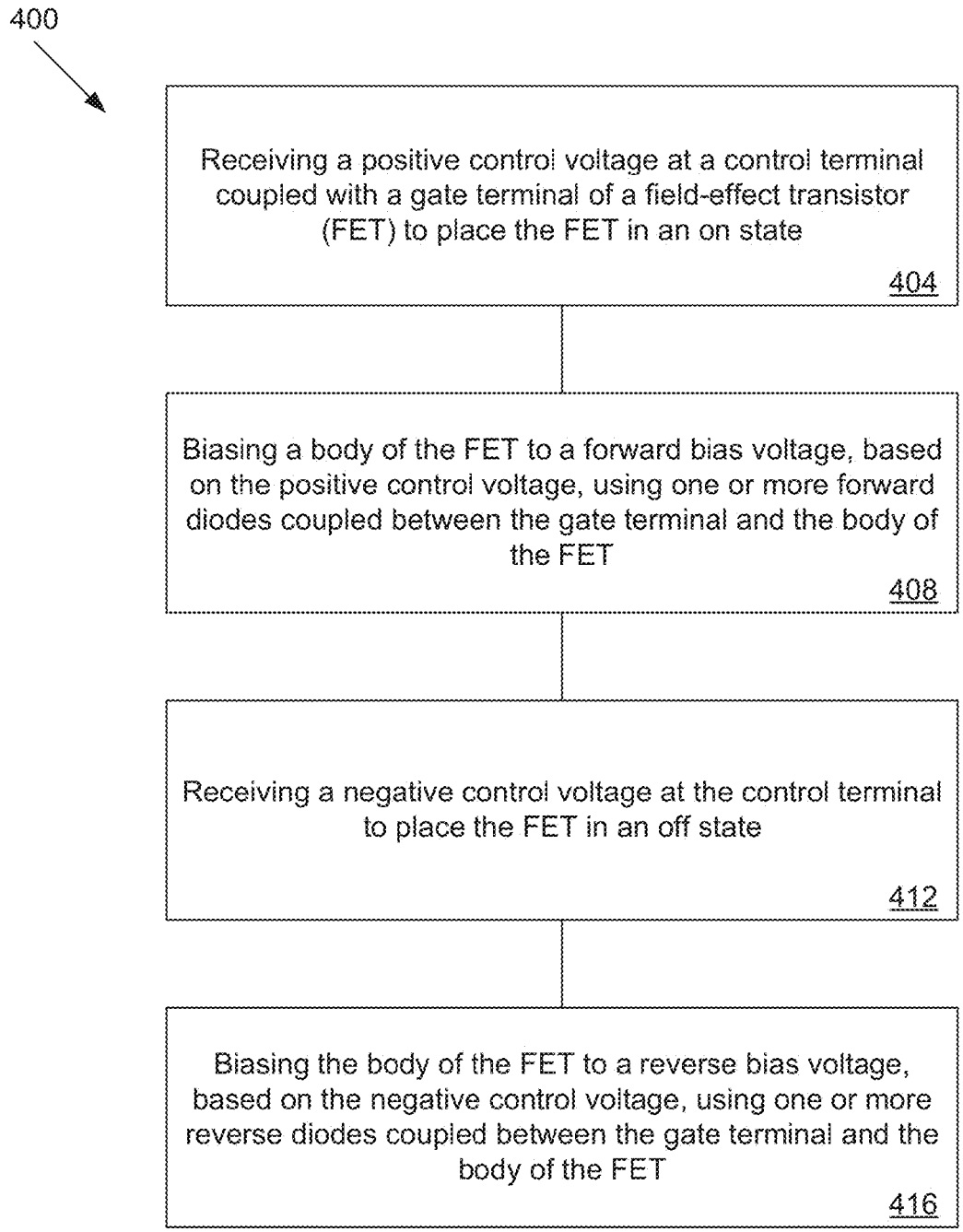
FIG. 4 illustrates a flow chart of a method for operating a switching device in accordance with various embodiments.

FIG. 4 illustrates a method 400 of operating a diode-biased FET (e.g., FET 104, 204, or 304) in accordance with various embodiments. The method 400 may include, at 404, receiving a positive control voltage at a control terminal coupled with a gate terminal of the FET to place the FET in an on state.

At 408, the method 400 may include biasing a body terminal of the FET to a forward bias voltage, based on the positive control voltage, using one or more forward diodes (e.g., forward diodes 132, 232, or 332) coupled between the gate terminal and the body terminal of the FET. The forward diodes may be coupled in series with one another between the gate terminal and the body terminal of the FET. The forward diodes may be any suitable type of diodes, such as p-n diodes or diode-connected FETs. The forward bias voltage at the body terminal may facilitate the on state of the FET. During the on state, the FET may pass a transmission signal between a drain terminal and a source terminal of the FET.

At 412, the method 400 may include receiving a negative control voltage at the control terminal to place the FET in an off state.

At 416, the method 400 may include biasing the body terminal of the FET to a reverse bias voltage, based on the negative control voltage, using one or more reverse diodes (e.g., reverse diode 136, 236, or 336). The reverse diodes may be any suitable type of diodes, such as p-n diodes or diode-connected FETs. The reverse bias voltage at the body terminal may facilitate the off state of the FET. During the off state, the FET may prevent a transmission signal from passing from the drain terminal to the source terminal of the FET.

In various embodiments, the circuit 100, 200, and/or 300 may be used to facilitate switching of a transmission signal. Some embodiments may include a switching module that includes a series FET and a shunt FET. The series FET may be coupled in series with an interconnect path to selectively pass the transmission signal to an output terminal (e.g., for transmission by an antenna module). The shunt FET may be coupled in shunt with the interconnect path to selectively divert the transmission signal from the interconnect path (e.g., to selectively pass the transmission signal to the ground terminal and prevent the transmission signal from being passed to the output terminal). In a first state of the switching module, the series transistor may be on and the shunt transistor may be off to pass the transmission signal to the output terminal. In a second state of the switching module, the series transistor may be off and the shunt transistor may be on to pass the transmission signal to the ground terminal and prevent the transmission signal from passing to the output terminal. At least one of the series FET or shunt FET may be configured with forward diodes and reverse diodes similar to FETs 104, 204, or 304 of FIG. 1, 2, or 3, respectively.

Figure 5:
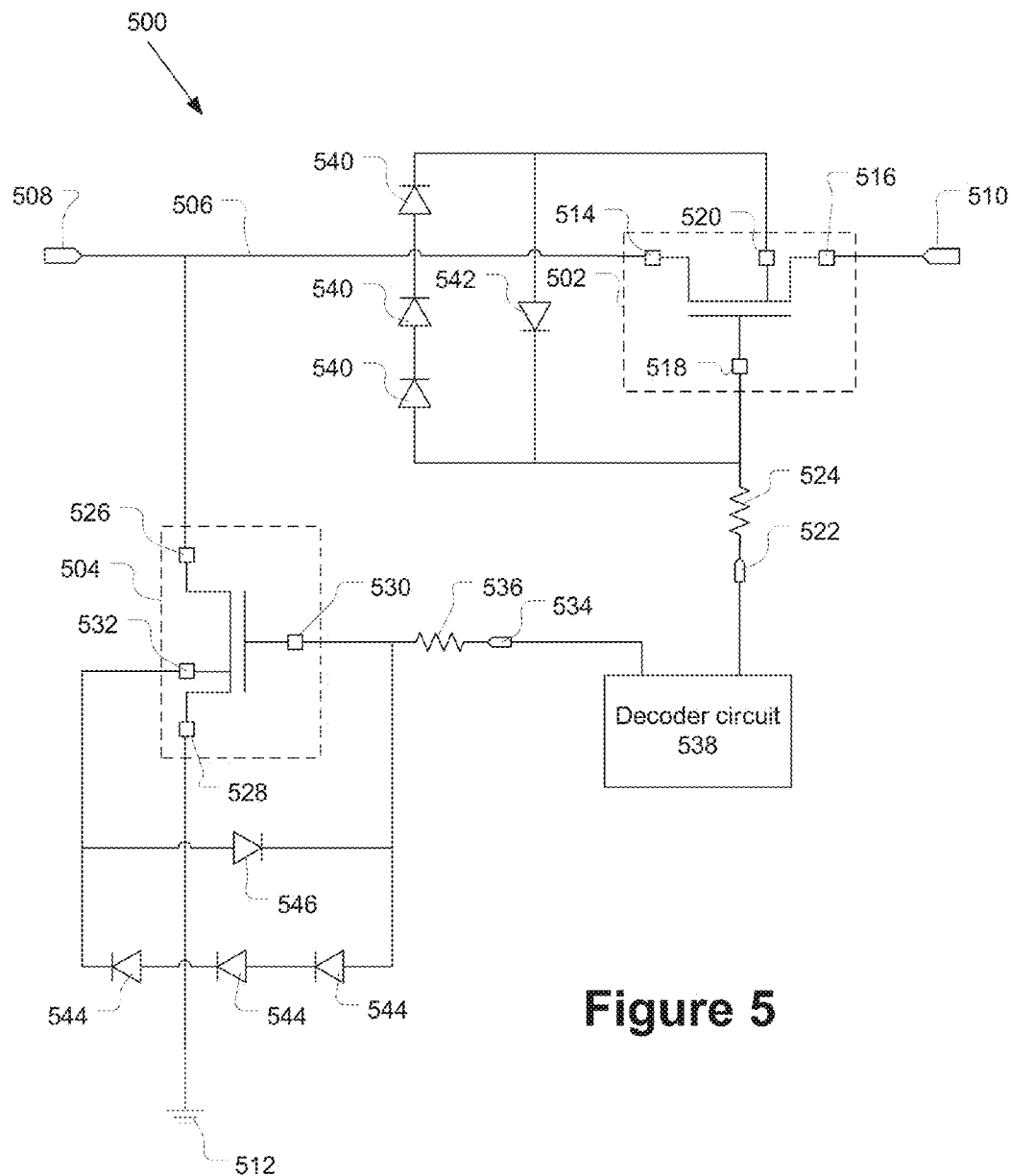
FIG. 5 illustrates a circuit diagram of a single-pole, single-throw switch including a series-shunt field-effect transistor (FET) pair in accordance with various embodiments.

FIG. 5 illustrates a switching circuit 500 (also referred to as circuit 500) that includes a series FET 502 and a shunt FET 504. The series FET 502 may be coupled in series with an interconnect path 506 between an input terminal 508 and an output terminal 510. The shunt FET 504 may be coupled in shunt with the interconnect path 506 (e.g., between the input terminal 508 and a ground terminal 512. The series FET 502 may include a drain terminal 514, a source terminal 516, a gate terminal 518, and a body terminal 520. The circuit 500 may further include a first control terminal 522 coupled with the gate terminal 518 of the series FET 502 (e.g., via a resistor 524).

The shunt FET 504 may include a drain terminal 526, a source terminal 528, a gate terminal 530, and a body terminal 532. The circuit 500 may further include a second control terminal 534 coupled with the gate terminal 530 of the shunt FET 504 (e.g., via a resistor 536).

The circuit 500 may be switchable between a first state and a second state. The circuit 500 may include a decoder circuit 538 coupled with the first control terminal 522 and the second control terminal 534. The decoder circuit 538 may provide a first control signal to the first control terminal 522 to control the series FET 502 and may provide a second control signal to the second control terminal 534 to control the shunt FET 504. The first and second control signals may be used to switch the circuit 500 between the first and second states.

In the first state, the series FET 502 may be on and the shunt FET 504 may be off. Accordingly, the circuit 500 may pass a transmission signal received at the input terminal 508 to the output terminal 510 (e.g., via the series FET 502).

In the second state, the series FET 502 may be off and the shunt FET 504 may be on. Accordingly, the circuit 500 may pass an RF signal received at the input terminal 508 to the ground terminal 512 (e.g., via the shunt FET 504). The circuit 500 may prevent the transmission signal from passing to the output terminal 510.

The circuit 500 may further include one or more forward diodes 540 and one or more reverse diodes 542 coupled between the gate terminal 518 and the body terminal 520 of the series FET 502. The one or more forward diodes 540 and one or more reverse diodes 542 may bias the body terminal 520 of the series FET 502 based on the first control signal, as described herein. Additionally, or alternatively, the circuit may include one or more forward diodes 544 and one or more reverse diodes 546 coupled between the gate terminal 530 and the body terminal 532 of the shunt FET 504. The one or more forward diodes 544 and one or more reverse diodes 546 may bias the body terminal 532 of the shunt FET 504 based on the second control signal, as described herein. Accordingly, the decoder circuit 538 may switch the circuit 500 between the first state and the second state using two control signals provided to respective control terminals.

It will be apparent that in some embodiments the series FET 502 may be included in a stack of a plurality of series FETs coupled between the input terminal 508 and the output terminal 510. The plurality of series FETs may be coupled in series with one another. Additionally, or alternatively, the shunt FET 504 may be included in a stack of a plurality of shunt FETs coupled between the input terminal 508 and the ground terminal 512. The plurality of shunt FETs may be coupled in series with one another.

Figure 6:
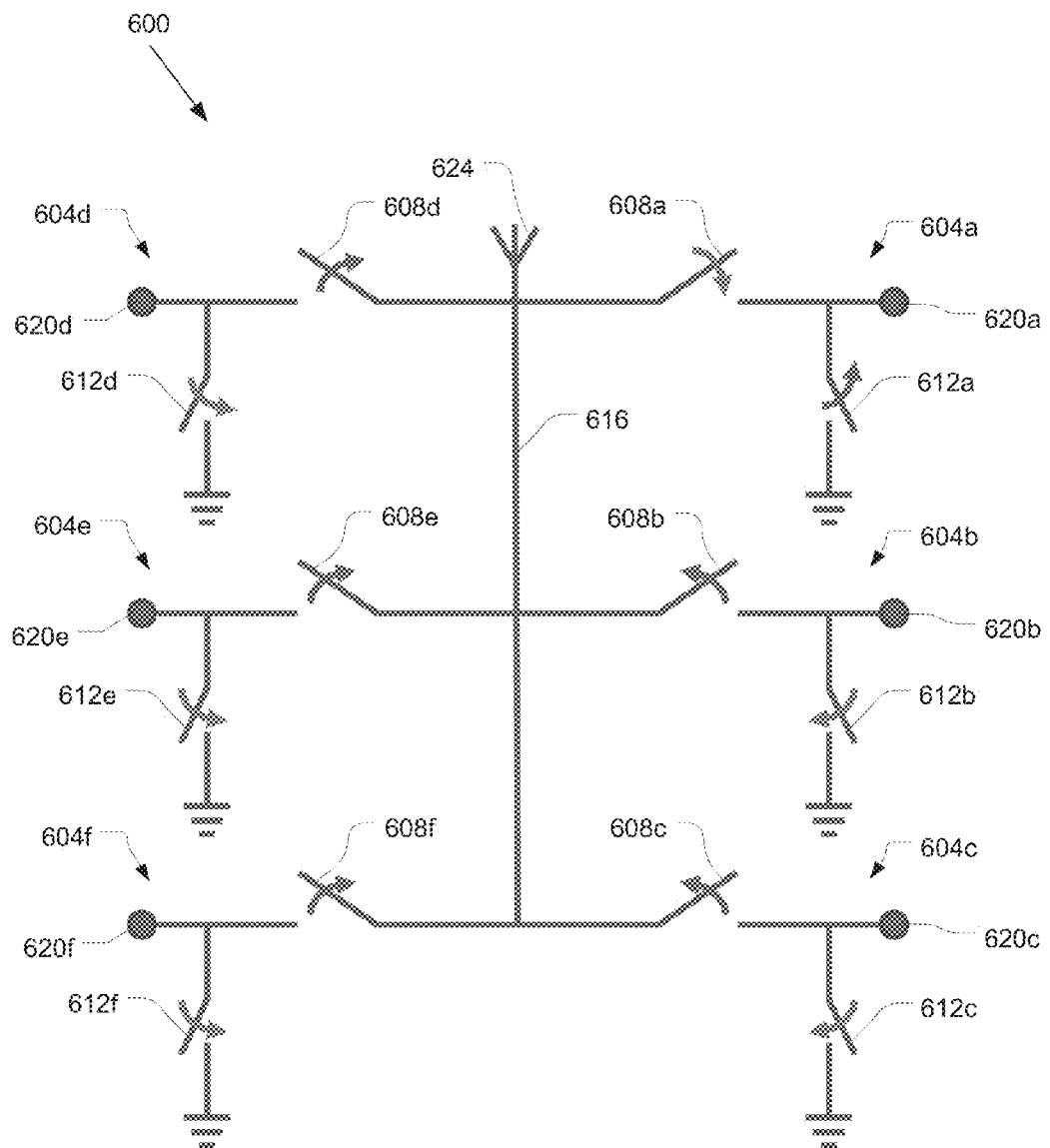
FIG. 6 illustrates a circuit diagram of a switching module including a plurality of switches coupled with a common output node in accordance with various embodiments.

Some embodiments may provide a switching module that includes a plurality of series-shunt pairs of FETs (e.g., circuit 500) coupled with a common output node. For example, FIG. 6 illustrates a switching module 600 that includes a plurality of switching devices 604a-f. The switching devices may be similar to circuit 500 shown in FIG. 5. The switching devices 604a-f may each include a series switch 608a-f and a shunt switch 612a-f. The series switches 608a-f and/or the shunt switches 612a-f may include diode-biased FETs similar to circuits 100, 200, or 300 in some embodiments. The switching devices 604a-f may be coupled with a common output node 616 to selectively pass an RF signal received at an input terminal 620a-f to the output node 616 during a first state of the switching device 604a-f. The output node 616 may be coupled with an antenna 624 to transmit the RF signal. Although typically only one switching device 604a-f will be in the first state at a given time (e.g., switching device 604a shown in FIG. 6), it will be apparent that any combination of zero or more switching devices may be in the first state at a given time. The series switches 608a-f and shunt switches 612a-f may be controlled by respective control signals provided by a decoder circuit (e.g., decoder circuit 538 shown in FIG. 5). Each switch may be controlled by a single control signal, which may reduce the number of control lines and/or simplify the decoder circuit compared with switching circuits that require more than one control signal for each FET.

Figure 7:
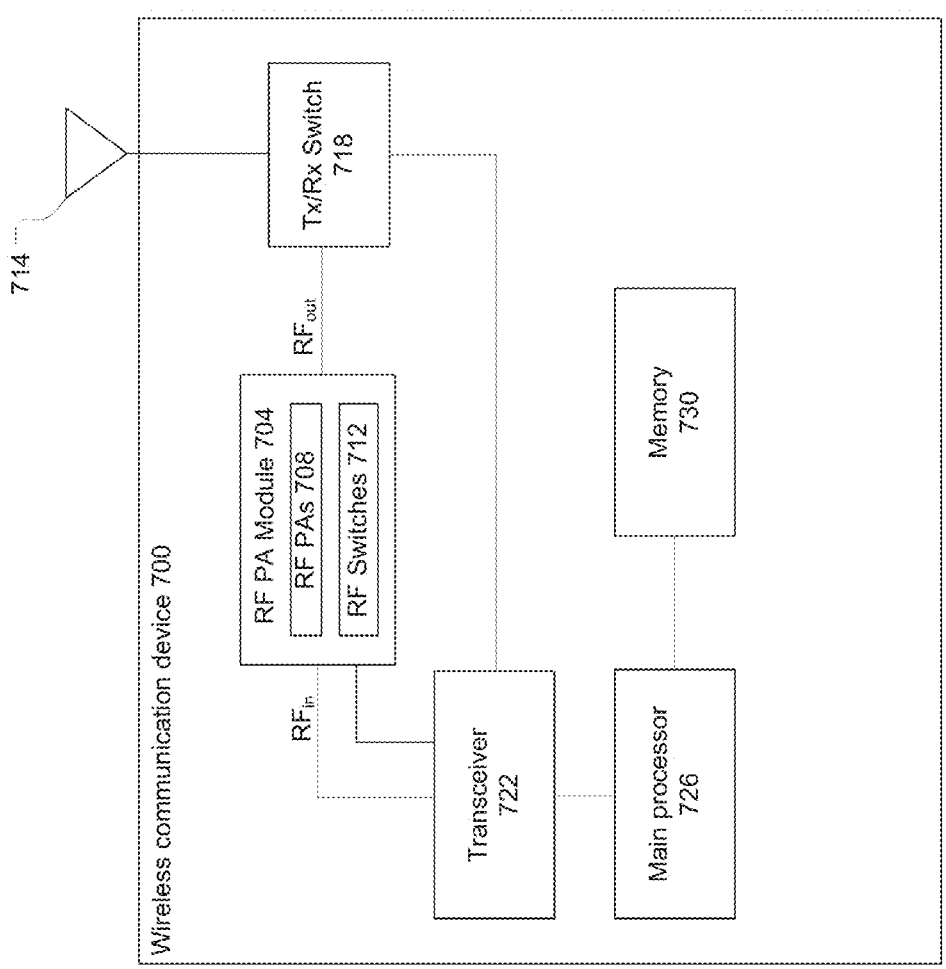
FIG. 7 is a block diagram of an exemplary wireless communication device in accordance with various embodiments.

A block diagram of an exemplary wireless communication device 700 is illustrated in FIG. 7 in accordance with some embodiments. Wireless communication device 700 may have an RF power amplifier (PA) module 704 including one or more RF PAs 708. RF PA module 704 may further include one or more RF switches 712 coupled with one or more of the RF PAs 708. The RF switches 712 may be similar to and/or include switching circuits 100, 200, 300, 500, and/or 600. Additionally, or alternatively, the RF switches 712 may be configured to carry out method 400.

In addition to the RF PA module 704, the wireless communication device 700 may have an antenna structure 714, a Tx/Rx switch 718, a transceiver 722, a main processor 726, and a memory 730 coupled with each other at least as shown. While the wireless communication device 700 is shown with transmitting and receiving capabilities, other embodiments may include devices with only transmitting or only receiving capabilities. While RF switches 712 are shown as included in RF PA module 704, in other embodiments, RF switches 712 may be included in other components of the wireless communication device 700, such as Tx/Rx switch 718 and/or transceiver 722, in addition to or instead of RF PA module 704.

In various embodiments, the wireless communication device 700 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 726 may execute a basic operating system program, stored in the memory 730, in order to control the overall operation of the wireless communication device 700. For example, the main processor 726 may control the reception of signals and the transmission of signals by transceiver 722. The main processor 726 may be capable of executing other processes and programs resident in the memory 730 and may move data into or out of memory 730, as desired by an executing process.

The transceiver 722 may receive outgoing data (e.g., voice data, web data, e-mail, signaling data, etc.) from the main processor 726, may generate the $RF_{in}$ signal(s) to represent the outgoing data, and provide the $RF_{in}$ signal(s) to the RF PA module 704. The transceiver 722 may also control the RF PA module 704 to operate in selected bands and in either full-power or backoff-power modes. In some embodiments, the transceiver 722 may generate the $RF_{in}$ signal(s) using OFDM modulation.

The RF PA module 704 may amplify the $RF_{in}$ signal(s) to provide $RF_{out}$ signal(s) as described herein. The $RF_{out}$ signal(s) may be forwarded to the Tx/Rx switch 718 and then to the antenna structure 714 for an over-the-air (OTA) transmission. In some embodiments, Tx/Rx switch 718 may include a duplexer. In a similar manner, the transceiver 722 may receive an incoming OTA signal from the antenna structure 714 through the Tx/Rx switch 718. The transceiver 722 may process and send the incoming signal to the main processor 726 for further processing.

The one or more RF switches 712 may be used to selectively pass RF signal(s) (e.g., $RF_{in}$ signal(s) and/or $RF_{out}$ signal(s)) to, from, and/or within components of wireless communication device 700.

In various embodiments, the antenna structure 714 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 700 is given by way of example and that, for simplicity and clarity, only so much of the construction and operation of the wireless communication device 700 as is necessary for an understanding of the embodiments is shown and described. Various embodiments contemplate any suitable component or combination of components performing any suitable tasks in association with wireless communication device 700, according to particular needs. Moreover, it is understood that the wireless communication device 700 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A switching apparatus comprising:
   a field-effect transistor (FET) having a gate terminal and a body terminal, the FET configured to transition between an on state and an off state, based on a control signal received at the gate terminal, to facilitate switching of a radio frequency (RF) signal;
   one or more forward diodes coupled between the gate terminal and the body terminal to bias the body terminal, based on the control signal, during the on state; and
   one or more reverse diodes coupled between the gate terminal and the body terminal to bias the body terminal, based on the control signal, during the off state.

2. The apparatus of claim 1, wherein the FET further includes a source terminal and a drain terminal, wherein the FET is configured to pass the RF signal from the source terminal to the drain terminal if the FET is in the on state.

3. The apparatus of claim 1, wherein the one or more forward diodes comprise one or more p-n diodes.

4. The apparatus of claim 3, wherein the one or more reverse diodes comprise one or more p-n diodes.

5. The apparatus of claim 3, wherein the one or more reverse diodes comprise one or more diode-connected n-type FETs.

6. The apparatus of claim 1, wherein the one or more forward diodes comprise one or more diode-connected p-type FETs, and wherein the one or more reverse diodes comprise one or more diode-connected n-type FETs.

7. The apparatus of claim 1, including three forward diodes and one reverse diode.

8. The apparatus of claim 1, wherein the apparatus is a silicon on insulator (SOI) device.

9. The apparatus of claim 1, wherein the one or more forward diodes are configured to bias the body terminal with a non-zero positive voltage during the on state.

10. The apparatus of claim 1, wherein the one or more reverse diodes are configured to bias the body terminal with a non-zero negative voltage during the off state.

11. The apparatus of claim 1, wherein the FET is a first FET, the forward diodes are first forward diodes, and the reverse diodes are first reverse diodes, wherein the first FET is coupled in series with an interconnect path to selectively pass the RF signal to an output terminal, and wherein the apparatus further comprises:
a second FET coupled in shunt with the interconnect path;
one or more second forward diodes coupled between a gate terminal and a body terminal of the second FET; and
one or more second reverse diodes coupled between the gate terminal and the body terminal of the second FET.

12. A circuit comprising:
a field-effect transistor (FET) having a source terminal, a drain terminal, a gate terminal, and a body terminal;
one or more forward diodes coupled in series with one another and further coupled between the gate terminal and the body terminal with a forward direction of the forward diodes oriented from the gate terminal to the body terminal; and
a reverse diode coupled between the gate terminal and the body terminal with a forward direction of the reverse diode oriented from the body terminal to the gate terminal.

13. The circuit of claim 12, wherein the one or more forward diodes comprise one or more p-n diodes.

14. The circuit of claim 13, wherein the reverse diode comprises a p-n diode.

15. The circuit of claim 13, wherein the one or more reverse diodes comprise one or more diode-connected n-type FETs.

16. The circuit of claim 12, wherein the one or more forward diodes comprise one or more diode-connected p-type FETs, and wherein the reverse diode comprises a diode-connected n-type FET.

17. The circuit of claim 12, including three to six forward diodes and one reverse diode.

18. The circuit of claim 12, wherein the FET is a silicon on insulator (SOI) device.

19. A system comprising:
a transceiver configured to provide a signal;
a power amplification module configured to receive the signal from the transceiver and amplify the signal for transmission; and
a switch module, disposed in the transceiver or in the PA module, the switch circuit having a switching device including:
a first field-effect transistor (FET) coupled in series with an interconnect path to pass the signal on the interconnect path during an on state of the switching device, the first FET including a first gate terminal and a first body terminal, wherein the first FET is responsive to a first control signal received at the first gate terminal;
a second FET coupled in shunt with the interconnect path to divert the signal from the interconnect path during an off state of the switching device, the second FET including a second gate terminal and a second body terminal, wherein the second FET is responsive to a second control signal received at the second gate terminal;
one or more forward diodes coupled between the first gate terminal and the first body terminal to bias the first body terminal, based on the first control signal, during the on state; and
one or more reverse diodes coupled between the first gate terminal and the first body terminal to bias the first body terminal, based on the first control signal, during the off state.

20. The system of claim 19, further comprising a decoder circuit coupled with the switch module to provide the first and second control signals.

21. The system of claim 19, wherein the switching device is a first switching device, wherein the switch module includes a plurality of switching devices including the first switching device, and wherein output terminals of the respective switching devices are coupled with a common output node.

22. The system of claim 21, further comprising an antenna module coupled with the output node to transmit the signal over a wireless communication network.

* * * * *